US008208586B2

(12) United States Patent
Tsuchiya et al.

(10) Patent No.: US 8,208,586 B2
(45) Date of Patent: Jun. 26, 2012

(54) JITTER MEASURING APPARATUS

(75) Inventors: Naosuke Tsuchiya, Atsugi (JP); Ken Mochizuki, Agsugi (JP); Seiya Suzuki, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 323 days.

(21) Appl. No.: 12/730,639

(22) Filed: Mar. 24, 2010

(65) Prior Publication Data

US 2010/0246655 A1 Sep. 30, 2010

(30) Foreign Application Priority Data

Mar. 30, 2009 (JP) ................................ 2009-083302

(51) Int. Cl.
*H04L 27/00* (2006.01)

(52) U.S. Cl. ........ 375/324; 375/224; 375/226; 375/340; 375/371

(58) Field of Classification Search .................. 375/324, 375/224, 226, 340, 371
See application file for complete search history.

(56) References Cited

U.S. PATENT DOCUMENTS 6,598,004 B1 * 7/2003 Ishida et al. .................... 702/69
6,795,496 B1 * 9/2004 Soma et al. ................... 375/226
7,386,042 B1 * 6/2008 Brewer ......................... 375/226

FOREIGN PATENT DOCUMENTS

JP 2001-133492 5/2001

* cited by examiner

*Primary Examiner* — Ted Wang
(74) *Attorney, Agent, or Firm* — Greer, Burns & Crain, Ltd.

(57) ABSTRACT

It is an object of the invention to correctly display the waveform of a demodulation signal with a single apparatus. A jitter demodulator which demodulates a jitter component of a digital signal input from the outside, a jitter amount detector which detects the amplitude value of a demodulation signal output from the jitter demodulator, an interpolator which measures a period of the demodulation signal output from the jitter demodulator and interpolates the demodulation signal processing with a rate corresponding to the measured period, a display unit, and a display control section which displays on the display unit the value detected by the jitter amount detector and a waveform of the demodulation signal interpolated by the interpolator are provided in a single housing.

6 Claims, 4 Drawing Sheets

JITTER MEASURING APPARATUS

BACKGROUND OF THE INVENTION

1. Field of the Invention

The present invention relates to a technique for checking a measurement result more accurately in a jitter measuring apparatus which measures a jitter characteristic of a digital signal output from a transmitter used for the high-speed digital communication represented by SDH (Synchronous Digital Hierarchy) and which displays the measurement result.

2. Description of the Related Art

In a system which transmits a binary digital signal, deterioration of the signal quality caused by a phase change in the digital signal, that is, caused by jitter is a problem.

For this reason, a jitter of a digital signal output from an object to be measured, such as a transmitter which handles a digital signal, is measured in order to measure the quality of the digital signal output from the object to be measured, the resistance to jitter, a transmission characteristic, and the like.

FIG. 6 shows the configuration of a known jitter measuring apparatus 10 used for the above-described object.

The jitter measuring apparatus 10 includes: a jitter demodulator 11 which receives a digital signal Dr of an object to be measured and demodulates a jitter component (phase-modulated component); a jitter amount detector 12 which detects as a jitter amount the amplitude, such as an effective value (RMS) or a peak-to-peak value, of a demodulation signal (assumed to be a signal converted into the digital value) output from the jitter demodulator 11; and a display unit 13 which displays the detected jitter amount as a numerical value.

In addition, a wideband jitter demodulator, a filter circuit of a band based on ITU-T recommended 0.172, and an A/D converter which operates at a predetermined sampling rate for outputting a demodulation signal as a digital value are included in the jitter demodulator 11.

An example of the jitter measuring apparatus which measures the jitter of an input digital signal as described above is disclosed in JP-A-2001-133492.

In the known apparatus described above, however, the waveform of a demodulation signal cannot be observed. Accordingly, in the case of a waveform which is completely different from a waveform that a measuring person expects, it is difficult to grasp the situation from the numerical result.

In order to solve such a problem, functions of converting the output of the jitter demodulator 11 into an analog signal by a D/A converter 15, inputting the converted analog signal to a filter 16 to remove a high-frequency component generated in the D/A conversion processing, and outputting it to the outside are provided in a known apparatus as shown by the dotted line in FIG. 6.

In the known apparatus, therefore, the waveform of a demodulation signal can be observed by inputting an analog demodulation signal, which is output to the outside, to an oscilloscope.

However, when the waveform of the analog demodulation signal output to the outside is observed as described above, the amplitude of the displayed wave may be largely different from the value detected by the jitter amount detector 12 due to the performance of the D/A converter 15 and the filter 16.

Particularly, the peak-to-peak value is largely affected by the analog characteristics of the D/A converter 15 and the filter 16. Accordingly, since the peak-to-peak value is different from the value detected at the main apparatus side in many cases, a decrease in accuracy on a screen for waveform observation becomes a problem. For this reason, it could not be said that the known apparatus performed sufficiently well when more accurate waveform information was required in the field of research and development of a transmitter and the like.

In addition, since the oscilloscope should be prepared to observe the waveform of a demodulation signal, there was also a problem that the installation place became large or a problem that the cost increased.

SUMMARY OF THE INVENTION

The invention has been finalized in order to solve such problems, and it is an object of the invention to provide a jitter measuring apparatus capable of displaying the waveform of a demodulation signal correctly by itself.

In order to achieve the above object, according to a first aspect of the invention, a jitter measuring apparatus includes: a housing; a jitter demodulator (21) which is received in the housing and which demodulates a jitter component of a digital signal input from the outside; a jitter amount detector (22) which is received in the housing and detects the amplitude value of a demodulation signal output from the jitter demodulator; an interpolator (23) which is received in the housing and which measures a period of the demodulation signal output from the jitter demodulator and interpolates the demodulation signal processing with a rate corresponding to the measured period; a display unit (25) provided on an outer surface of the housing; and a display control section (24) which is received in the housing and displays on the display unit the value detected by the jitter amount detector and a waveform of the demodulation signal interpolated by the interpolator.

Moreover, according to a second aspect of the invention, in the jitter measuring apparatus according to the first aspect of the invention, it is preferable to have a mode in which the jitter amount detector performs processing for detecting the amplitude value of the demodulation signal interpolated by the interpolator instead of the demodulation signal output from the jitter demodulator.

Moreover, according to a third aspect of the invention, in the jitter measuring apparatus according to the first or second aspect of the invention, it is preferable to further include: a trigger circuit (26) which is received in the housing and which outputs a trigger signal when the demodulation signal interpolated by the interpolator changes in a predetermined direction to reach a threshold value set beforehand; a waveform memory (28) which is received in the housing and which stores the interpolated demodulation signal; and a storage control means (27) which is received in the housing and which stores the interpolated demodulation signal in the waveform memory until a predetermined time passes after the trigger signal is received. In addition, it is preferable that the display control section displays the demodulation signal, which is stored in the waveform memory, on the display unit.

Moreover, according to a fourth aspect of the invention, in the jitter measuring apparatus according to any one of the first to third aspects of the invention, it is preferable to further include a test digital signal generating section (30) which is received in the housing and which transmits a test digital signal, to which a jitter is given by a modulation signal, to the outside. In addition, it is preferable that the display control section displays a waveform of the modulation signal, which is used by the test digital signal generating section, and a waveform of the interpolated demodulation signal on the display unit so that comparison between the waveforms is possible.

Thus, the jitter measuring apparatus according to the aspect of the invention has functions of performing interpolation processing on the demodulation signal output from the jitter demodulator and displaying the waveform of the interpolated demodulation signal, and the circuits for realizing the functions are received in the common housing. Accordingly, the waveform of the demodulation signal can be correctly displayed by the single apparatus.

Moreover, when the jitter amount detector performs processing for detecting the amplitude of the interpolated demodulation signal, a more accurate amplitude value can be detected.

In addition, since the interpolated demodulation signal is stored until a predetermined time passes after the interpolated demodulation signal reaches the threshold value and the waveform of the stored demodulation signal is displayed, the demodulation signal can be observed as a stopped waveform. Accordingly, the waveform can be observed more finely.

In addition, since the waveform of a modulation signal used to give a jitter to a test digital signal is displayed such that the comparison with the interpolated demodulation signal is possible, a jitter transmission characteristic of the object to be tested can be checked by the waveform.

DESCRIPTION OF THE PREFERRED EMBODIMENTS

Hereinafter, an embodiment of the invention will be described with reference to the accompanying drawings.

Figure 1:
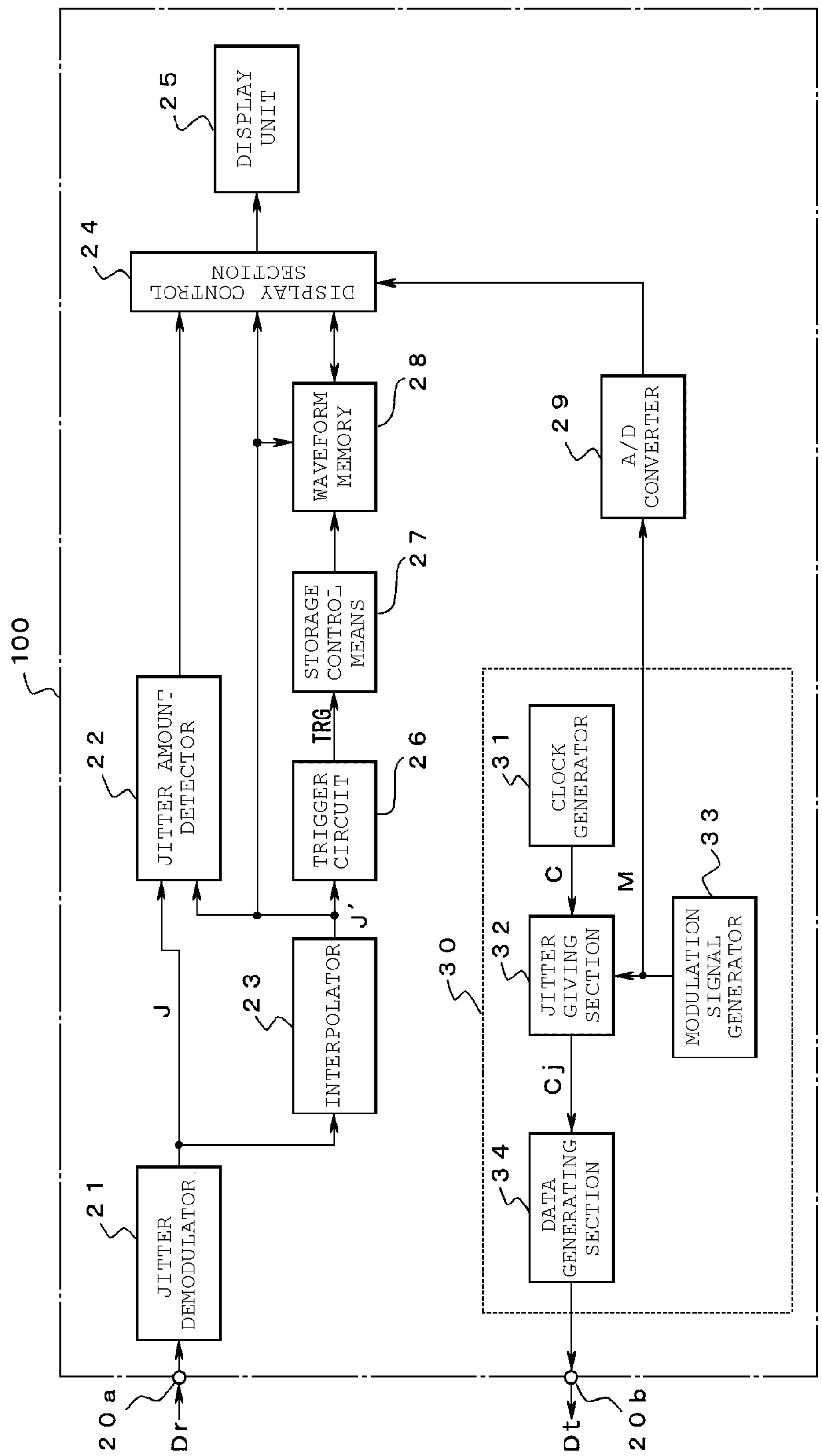
FIG. 1 is a view showing the entire configuration in an embodiment of the invention.

FIG. 1 shows the configuration of a jitter measuring apparatus 100 of an embodiment to which the invention is applied.

The jitter measuring apparatus 100 is assumed to have a single housing 20 which receives each section shown in FIG. 1 therein and indicated by the dotted line. An input terminal 20*a* for input of a digital signal Dr of an object to be measured and an output terminal 20*b* for outputting a test digital signal Dt to the outside are provided outside the housing.

A test digital signal generating section 30 for generating the test digital signal Dt is provided in the jitter measuring apparatus 100.

In the test digital signal generating section 30, a clock signal C with a predetermined frequency output from a clock signal generator 31 is input to a jitter giving circuit 32, and a modulation signal M (for example, a sinusoidal wave up to 80 kHz to 320 MHz) output from a modulation signal generator 33 is input to the jitter giving circuit 32. Then, phase modulation of the clock signal is performed using the modulation signal M in order to generate a clock signal Cj with jitter which has a size corresponding to the amplitude of the modulation signal M, and the clock signal Cj is input to a data generating section 34.

The data generating section 34 generates the test digital signal Dt with a predetermined pattern (for example, a pattern of a pseudo-random signal), which is synchronized with the input clock signal Cj, and gives the test digital signal Dt to an external object to be measured through the output terminal 20*b* when necessary.

In addition, the digital signal Dr output from the test object is input to a jitter demodulator 21 through the input terminal 20*a*.

In the jitter demodulator 21, a wideband jitter demodulator, a filter circuit of a band based on ITU-T recommended 0.172 (for example, a high pass filter of 80 kHz or 16 MHz and a low pass filter of 320 MHz when the bit rate of the digital signal Dr is 40 Gbps), and an A/D converter which operates at a predetermined sampling rate (for example, 720 Msample/s) for outputting a demodulation signal as a digital value are included in the same manner as described above. Accordingly, a phase change of the input digital signal Dr with respect to the reference phase of the clock component is detected, and a demodulation signal J with an amplitude according to the phase change is output as a digital value.

A frequency of the demodulation signal J is in a range of 80 kHz to 320 MHz when the filter circuit is formed by a high pass filter of 80 kHz and a low pass filter of 320 MHz.

The demodulation signal J is input to a jitter amount detector 22 and an interpolator 23.

The jitter amount detector 22 has a first mode, in which detection processing of the amplitude value (an effective value and a peak-to-peak value) of the demodulation signal J is performed, and a second mode, in which detection processing of the amplitude value (an effective value and a peak-to-peak value) of a demodulation signal J' interpolated by the interpolator 23 is performed. The mode is designated by an operating section (not shown) of the jitter measuring apparatus 100.

The interpolator 23 measures a period of the demodulation signal J and interpolates the demodulation signal processing with a rate corresponding to the measured period T.

Figure 2:
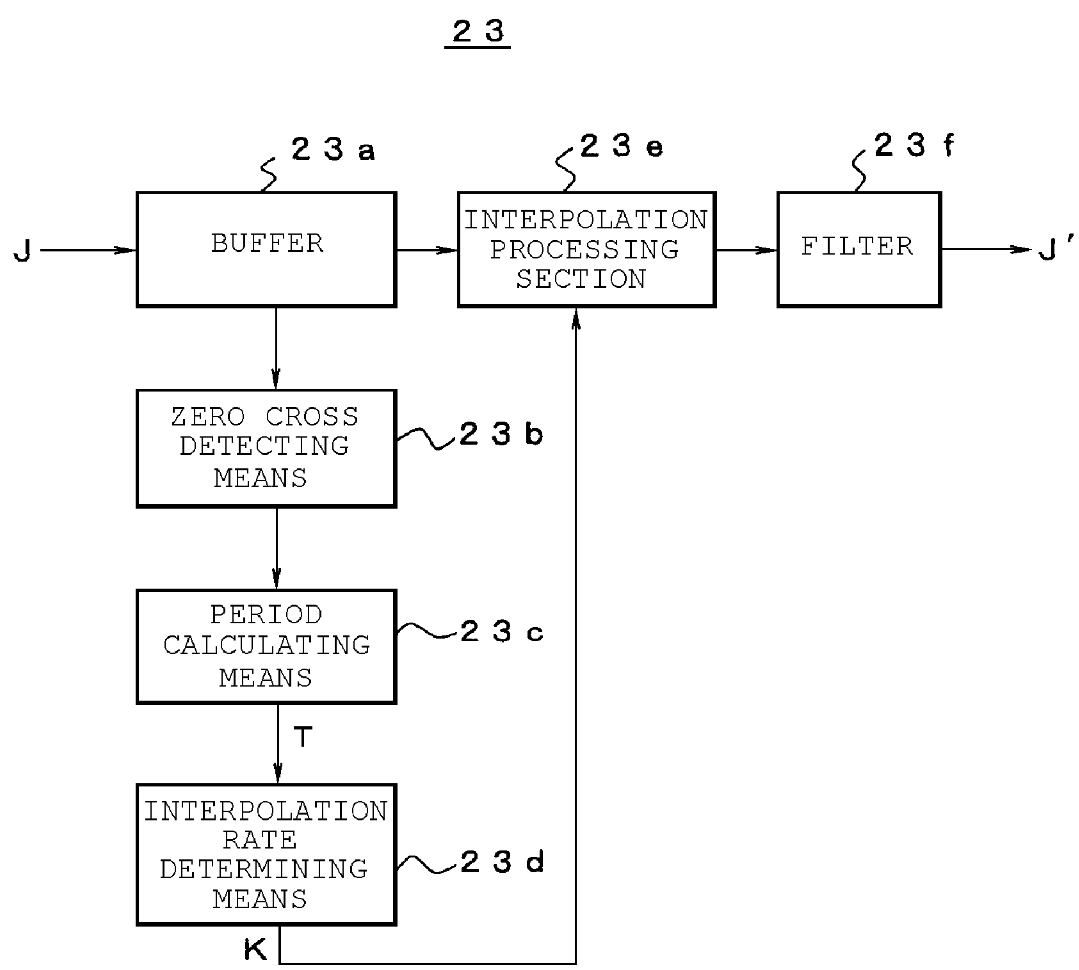
FIG. 2 is a view showing the configuration of main sections in the embodiment.

As shown in FIG. 2, the interpolator 23 stores the input demodulation signal J temporarily in a buffer 23*a*, performs processing for detecting a zero cross (actually, an address position closest to zero) on the stored data by a zero cross detecting means 23*b*, and detects the period T of the demodulation signal J from the detected zero cross position and the sampling rate of the demodulation signal by a period calculating means 23*c*.

In addition, the size required for the buffer 23*a* changes with a band in which measurement is performed. When a signal band after passing through the filter of the jitter demodulator 21 is 80 kHz, the size which allows 9000 or more samples to be stored is preferable assuming that the sampling rate is 720 Msample/s.

An interpolation rate determining means 23*d* determines an interpolation rate K, which corresponds to the calculated period T, among the interpolation rates set beforehand for the period range of the demodulation signal J and inputs the determined interpolation rate K to an interpolation processing section 23*e*.

Regarding the interpolation rate, the range of the period (frequency) of the demodulation signal J is divided into four steps, for example. The higher interpolation rate (for example, 2 to 20) is assigned to a region with a higher frequency.

The interpolation processing section 23*e* inserts the data of 0 values, the number of which is "K−1", continuously between input data streams. Then, by inputting the zero-inserted data streams to a low pass type filter 23*f* with a tap coefficient corresponding to the characteristic of sin(x)/x and adjusting the gain appropriately, the zero-inserted data streams are converted into the demodulation signal J' in which continuous interpolation between the original data J has been performed. Then, the demodulation signal J is output.

The demodulation signal J' interpolated by the interpolator 23 is input to the jitter amount detector 22, a display control section 24, and a trigger circuit 26.

As described above, the jitter amount detector 22 performs processing for detecting the amplitude of one of the demodulation signals J and J' which is designated by the user.

In addition, the display control section 24 displays the amplitude value (an effective value and a peak-to-peak value), which was detected by the jitter amount detector 22, as a numerical value on a display unit 25 and performs processing of displaying the waveform of the demodulation signal J'.

The trigger circuit 26 outputs a trigger signal TRG to a storage control means 27 when the interpolated demodulation signal J' changes in a predetermined direction (increasing or decreasing direction) to reach a threshold value R set beforehand.

The storage control means 27 stores the demodulation signal J' in a waveform memory 28 until a predetermined time (period for storing a required number of data items) passes after receiving the trigger signal TRG.

In addition, the modulation signal M is converted into a digital signal string by an A/D converter 29 and is then input to the display control section 24.

The display control section 24 can display the jitter measurement result on the display unit 25 in various modes by designation of the user.

That is, examples of the measurement result which can be displayed include: the amplitude value detected for the demodulation signal J (an effective value Jrms and a peak-to-peak value Jpp); the amplitude value (an effective value Jrms' and a peak-to-peak value Jpp') detected for the interpolated demodulation signal J'; the waveform of the demodulation signal J' output from the interpolator 23 (in this case, a waveform is displayed over a period equal to or larger than a time required for interpolation processing; however, a stopped waveform can be viewed by displaying the waveform data acquired in single shot), the waveform of the demodulation signal J' stored in the waveform memory 28 (in this case, the start position of a waveform stored and updated is the same), and the waveform of the modulation signal M. These may be singly displayed by selection or may be displayed on the same screen of the display unit 25 by arbitrary combination. In any case, waveform display (for example, waveform display shown in FIG. 5 which will be described later) of the interpolated demodulation signal J' is possible. As a result, it is possible to observe the correct waveform of a jitter demodulation signal with the single apparatus.

Figure 3:
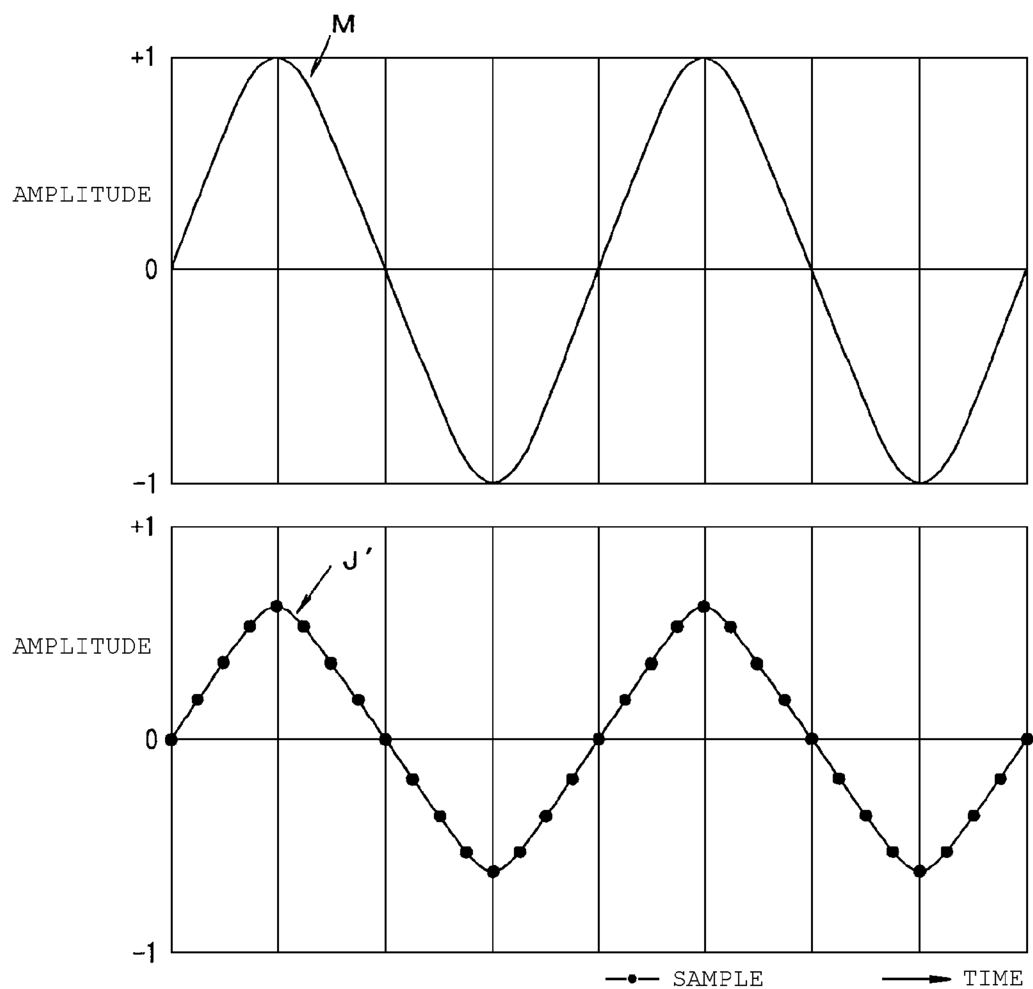
FIG. 3 is a view showing a display example of a measurement result in the embodiment.

Among those described above, if the waveform of the demodulation signal J' (either the demodulation signal output from the interpolator 23 or the demodulation signal stored in the waveform memory 28) and the waveform of the modulation signal M are displayed side by side on the same time axis so that the comparison therebetween is possible, for example, as shown in FIG. 3, the jitter transmission characteristic of the object to be measured can be checked by the jitter waveform itself. In the example shown in FIG. 3, it can be seen that the jitter is suppressed.

Here, a difference between the demodulation signal J and the interpolated demodulation signal J' will be described briefly.

Figure 4:
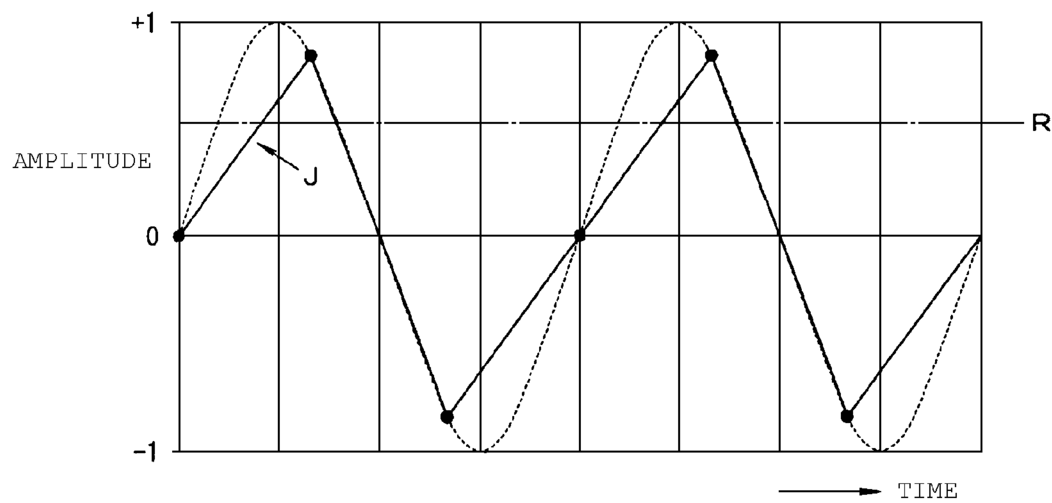
FIG. 4 is a view showing a waveform of a demodulation signal which is not interpolated.

Assuming that an original jitter component included in the input digital signal Dr is a sinusoidal wave of $\sin(2\pi ft)$, the demodulation signal J when the jitter frequency f is close to the sampling rate changes as shown by black circles in FIG. 4 (original sinusoidal wave is shown by a dotted line).

The maximum value of a waveform (solid line) which connects the black circles is smaller than the original value 1, and the minimum is larger than the original value −1. This waveform is also a waveform (triangular wave) which is very different from the original sinusoidal wave.

Therefore, as described above, even if the data stream is analog-converted and filtered, the peak magnitude changes due to the loss or the band characteristic of a filter. As a result, the original values ±1 are not obtained in many cases.

Figure 5:
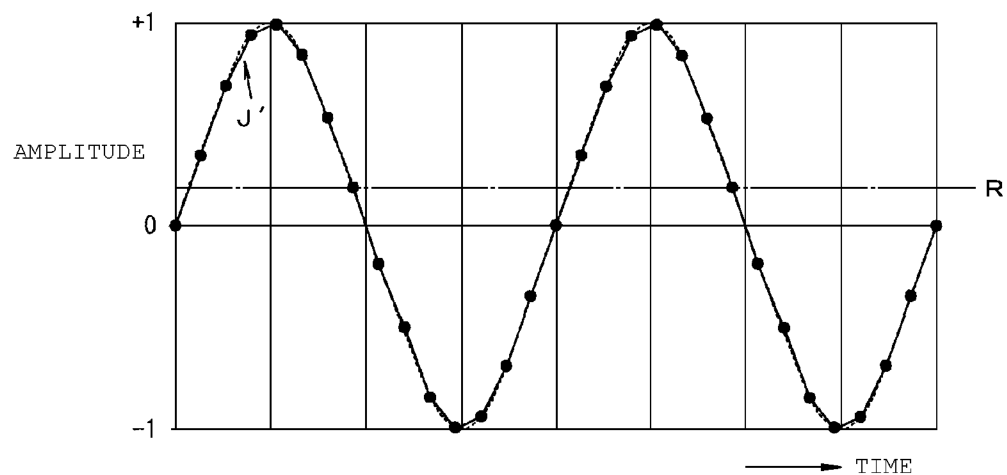
FIG. 5 is a view showing a waveform of an interpolated demodulation signal.
Figure 6:
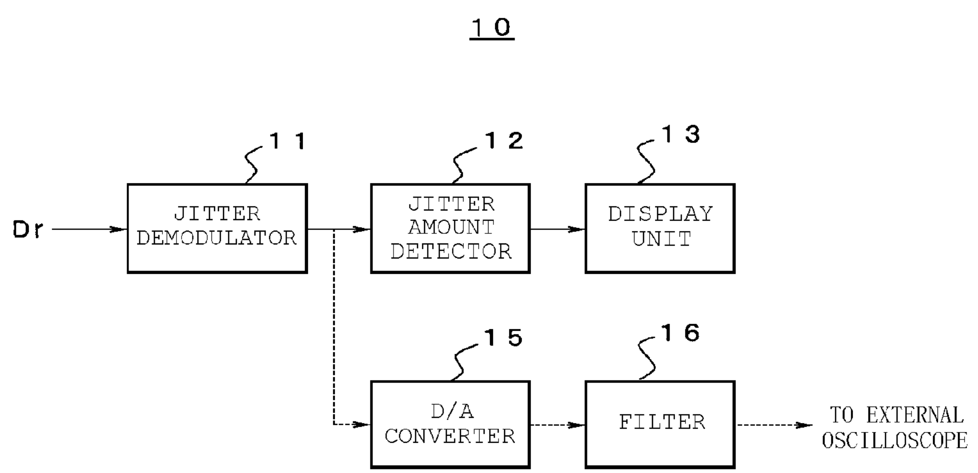
FIG. 6 is a view showing the configuration of a known apparatus.

On the other hand, the demodulation signal J' obtained by interpolating the demodulation signal J with an interpolation rate 5 (four zero insertion interpolation) changes as shown by black circles in FIG. 5. The maximum and minimum values of a waveform (solid line) which connects the black circles are almost equal to the original values ±1, and the waveform itself is close to a sinusoidal wave. Accordingly, it can be considered that the correct peak magnitude is displayed.

Moreover, when there are sampled values of only three points in one period of the waveform as shown in FIG. 4, the probability that the sampled values will become equal to the threshold value R is very low even if an arbitrary value is set as the threshold value R. Accordingly, waveform display of a trigger mode cannot be performed smoothly. However, the demodulation signal J' interpolated as shown in FIG. 5 has the sampled values of 15 points in one period of the waveform. Accordingly, since the probability that the sampled values will become equal to the threshold value R is extremely high, display of a stopped waveform in the trigger mode can be performed smoothly.

As described above, since the waveform accuracy in a measurement result of the interpolated demodulation signal J' is remarkably high compared with that of the original demodulation signal J, a jitter state of the digital signal Dr can be checked more accurately from the detected amplitude value or the display waveform. Therefore, performance is sufficient when more accurate waveform information is required in the field of research and development of a transmitter and the like.

In addition, since it is possible to observe the waveform correctly with a single apparatus, the problem that the installation place becomes large or the problem that the cost increases are also solved.

In addition, although the jitter measuring apparatus 100 according to the embodiment described above has the test digital signal generating section 30, it is also possible to adopt a configuration in which the test digital signal generating section 30 is not included.

What is claimed is:

1. A jitter measuring apparatus comprising:

a jitter demodulator which demodulates a jitter component of a digital signal input from the outside;

a jitter amount detector which detects the amplitude value of a demodulation signal output from the jitter demodulator;

a display unit for displaying the value detected by the jitter amount detector;

an interpolator which measures a period of the demodulation signal output from the jitter demodulator and interpolates the demodulation signal processing with a rate corresponding to the measured period;

a display control section which displays on the display unit the value detected by the jitter amount detector and a waveform of the demodulation signal interpolated by the interpolator; and a housing, wherein the jitter demodulator, the jitter amount detector, the interpolator, and the display control section are contained in the one housing, and the display unit is mounted on an outer surface of the housing.

2. The jitter measuring apparatus according to claim 1, wherein there is a mode in which the jitter amount detector performs processing for detecting the amplitude value of the demodulation signal interpolated by the interpolator instead of the demodulation signal output from the jitter demodulator.

3. The jitter measuring apparatus according to claim 1 or 2, further comprising:

a trigger circuit which is received in the housing and which outputs a trigger signal when the demodulation signal interpolated by the interpolator changes in a predetermined direction to reach a threshold value set beforehand;

a waveform memory which is received in the housing and which stores the interpolated demodulation signal; and a storage control means which is received in the housing and which stores the interpolated demodulation signal in the waveform memory until a predetermined time passes after the trigger signal is received, wherein the display control section displays the demodulation signal, which is stored in the waveform memory, on the display unit.

4. The jitter measuring apparatus according to claim 1 or 2, further comprising:

a test digital signal generating section which is received in the housing and which transmits a test digital signal, to which a jitter is given by a modulation signal, to the outside, wherein the display control section displays a waveform of the modulation signal, which is used by the test digital signal generating section, and a waveform of the interpolated demodulation signal on the display unit so that comparison between the waveforms is possible.

5. The jitter measuring apparatus according to claim 3, further comprising:

a test digital signal generating section which is received in the housing and which transmits a test digital signal, to which a jitter is given by a modulation signal, to the outside, wherein the display control section displays a waveform of the modulation signal, which is used by the test digital signal generating section, and a waveform of the interpolated demodulation signal on the display unit so that comparison between the waveforms is possible.

6. A jitter measuring method comprising the steps of: preparing a jitter demodulator which demodulates a jitter component of a digital signal input from the outside;

preparing a jitter amount detector which detects the amplitude value of a demodulation signal output from the jitter demodulator;

preparing a display unit for displaying the value detected by the jitter amount detector;

preparing an interpolator which measures a period of the demodulation signal output from the jitter demodulator and interpolates the demodulation signal processing with a rate corresponding to the measured period;

preparing a display control section which displays on the display unit a waveform of the demodulation signal interpolated by the interpolator;

preparing a housing; and performing assembly after receiving the jitter demodulator, the jitter amount detector, the interpolator, and the contained control section in the one housing and performing assembly after mounting the display unit on an outer surface of the housing.

* * * * *